United States Patent [19]

Koyama

[11] Patent Number: 5,272,110

[45] Date of Patent: Dec. 21, 1993

[54] METHOD OF FORMING WIRINGS

[75] Inventor: Kazuhide Koyama, Kanagawa, Japan

[73] Assignee: Sony Corporation, Tokyo, Japan

[21] Appl. No.: 890,004

[22] Filed: May 29, 1992

[30] Foreign Application Priority Data

May 30, 1991 [JP] Japan .................. 3-155763

[51] Int. Cl.⁵ ............................... H01L 21/44
[52] U.S. Cl. ..................... 437/190; 437/194
[58] Field of Search .................. 437/190, 194

[56] References Cited

U.S. PATENT DOCUMENTS

| 4,884,123 | 11/1989 | Dixit et al. | 437/190 |
| 4,977,105 | 12/1990 | Okamoto et al. | 437/190 |
| 5,081,064 | 1/1992 | Inoue et al. | 437/194 |
| 5,106,781 | 4/1992 | Penning De Vries | 437/190 |
| 5,124,780 | 6/1992 | Sandhu et al. | 437/194 |

FOREIGN PATENT DOCUMENTS

| 62-133713 | 6/1987 | Japan | 437/190 |
| 62-165342 | 7/1987 | Japan . | |
| 63-77117 | 4/1988 | Japan | 437/190 |

OTHER PUBLICATIONS

S. Wolf, Silicon Processing for the VLSI Era, vol. 2, Lattice Press, Sunset Beach, 1990, pp. 189-191, 254-255.

Primary Examiner—Brian E. Hearn
Assistant Examiner—Laura M. Holtzman
Attorney, Agent, or Firm—Hill, Steadman & Simpson

[57] ABSTRACT

A method of forming wirings which comprises depositing an Al or Al alloy wiring material to a predetermined thickness on a semiconductor substrate having a stepped dent such as a connection hole thereby filling and flattening the dent, then etching back the Al or Al alloy film to leave a portion to a predetermined thickness in the direction of the thickness, and a stop of patterning the thus left Al or Al alloy wiring material in desired wiring shape. Filling and flattening for the dent of the semiconductor substrate can be attained without causing trouble for the subsequent flattening of the inter-layer film, while preventing the reduction of the Al grain size of the Al or Al alloy film and preventing reduction of the electromigration resistance.

4 Claims, 3 Drawing Sheets

Example 2(2)

Example 1

- 4 Aℓ-1%Si
- 2 Ti (Barrier metal layer)
- 3 connection hole (stepped dent)
- 1 substrate

- 5 Wiring

Example 2(1)

- 4 Al alloy
- 8 SiO₂ (anti-diffusion layer)
- 7 Ti(O)N
- 6 Ti
- 9 Inter-layer film
- 1 Substrate
- 2 Barrier metal layer Example 2(2)

Comparison for the difference of the filling shape

METHOD OF FORMING WIRINGS

BACKGROUND OF THE INVENTION

1. Field of the Invention

The present invention concerns a method of forming wirings in a production step for semiconductor devices.

2. Description of the Prior Art

Along with recent improvement for the degree of integration in semiconductor integrated circuits, the size of devices have been reduced, as well as wirings connecting the devices have become finer and the multi-layered structure therefor has been developed further. The diameter for connection holes (contact holes, via holes) is also reduced along with the refinement of the wirings but reduction in the thickness of the inter-layer insulation film has a limit in view of the voltage withstanding and stray capacity. Therefore, the aspect ratio of the connection hole, that is, the depth-to-diameter ratio of the hole is naturally increased and, as a result, filling and flattening of the connection hole gives a significant problem.

As a method of attaining the filling and flattening, there has been a bias sputtering method of conducting sputtering while applying a negative DC bias voltage or RF bias voltage, a high temperature bias sputtering method of forming a film while heating a substrate, or a high temperature sputtering method using both of the above-mentioned methods together (for example, refer to Semiconductor World, Monthly Journal, General description by the present inventor, February, 1988, p 77).

In each of the methods, Al which is deposited on the substrate is at a high temperature, for example, of 425° to 500° C., and either vigorously migrates at the surface of the substrate or is entirely fluidizes to flow into the connection hole thereby improving the filling property to attain the flattening.

Further, a wiring of an Al alloy/Ti(O)N/Ti structure using TiN or TiON as a barrier metal has been often used recently for preventing Al from passing through a shallow diffusion layer in a contact hole.

However, even when the improving method for the filling and flattening of the connection hole at a high aspect ratio described above is used, the thickness of the Al film has to be increased in order to supply enough Al to fill the inside of the connection hole. For instance, in a case of a hole with a hole diameter of 0.8 um and a depth of 0.5 um, an Al film of 5000 Å thickness forms a dent at the surface as shown in FIG. 4(a) and, accordingly, a thickness of greater than 6000 Å is required for the Al film. The surface is flattened as shown in FIG. 4(b) in a case where the thickness of the Al film is 8000 Å.

In the drawing, 4 denotes an aluminum film (in particular, aluminum alloy film containing 1% Si), 2 denotes a titanium layer and 9 denotes an inter-layer film ($SiO_2$). FIG. 4(a) and (b) are views prepared from reference photograph.

However, in a case of the Al film of 8000 Å thickness, subsequent flattening for the inter-layer film is made difficult.

On the other hand, in a case of using the barrier metal, the crystal grain size of the Al film formed on the Ti(O)N film is decreased due to diffusion of Ti from the barrier metal film to bring about a problem that electromigration resistance is reduced.

OBJECT OF THE INVENTION

The present invention has been achieved with an aim of overcoming the various practical problems described above in the method of forming wirings of semiconductors.

A first object of the present invention is to provide a method of forming wirings capable of satisfying filling and flattening of a connection hole and subsequent flattening of an inter-layer film together.

A second object of the present invention is to provide a method of forming wirings capable of preventing the decrease of a crystal grain size in an Al film formed on a barrier metal film and overcoming the problem in the reduction of the electromigration resistance.

SUMMARY OF THE INVENTION

The first object of the present invention can be obtained by a method of forming wirings which comprises:

a step of depositing an aluminum series wiring material on the entire surface of a substrate having a stepped dent or contact hole to a thickness enough to form a flattened surface, a step of etching back to the aluminum series wiring material thereby leaving a portion thereof in the direction of the thickness to a predetermined thickness, and a step of patterning the thus left aluminum series wiring material into a predetermined wiring shape.

Another object of the present invention can be attained by a method of forming wirings which comprises:

a step of forming a barrier layer thinly and conformably on the entire surface of a substrate having a stepped dent, a step of forming an anti-diffusion layer thinly to the stepped dent at least excepting for the bottom and a step of forming an aluminum series wiring material over the entire surface of the substrate.

In the present invention, the stepped dent means a recess formed on a substrate, including connection holes in multi-layered wirings such as contact holes or via holes. Further, the aluminum series material means those materials such as aluminum and aluminum containing Al alloys.

In the first aspect of the present invention, since the Al series material is deposited to a thickness which is enough to form a flattened surface and then etched back to leave a thin Al material film of a predetermined thickness upon filling and flattening the connection hole, there is no trouble in the subsequent flattening for the inter-layer film.

In the second aspect of the present invention, since the barrier metal layer is formed conformally, then the $SiO_2$ and Al series film are formed in the same manner and Al and $SiO_2$ at the bottom of the contact hole of poor coverage are eliminated by reverse sputtering to such an extent as leaving them on the inter-layer, the $SiO_2$ remaining on the inter-layer functions as an anti-diffusion layer of the barrier metal, thereby enabling to prevent the reduction of the electromigration resistance due to the decrease of the crystal grain size of the Al series film.

DESCRIPTION OF THE ACCOMPANYING DRAWINGS

These and other objects, as well as advantageous features of the present invention will become apparent by reading the following descriptions for the preferred embodiment according to the present invention in conjunction with the drawings, wherein FIGS. 1a, 1b and 1c shows the steps of the first embodiment sequentially as cross sectional views of deposited materials;

DETAILED DESCRIPTION OF THE PREFERRED EMBODIMENTS

The present invention will now be described by way of its preferred embodiments with reference to the drawings. However it should be noted that the present invention is not restricted only to the embodiments described below.

EXAMPLE 1

In this example, the first feature of the present invention is applied to a method of forming wirings in a semiconductor device, in particular, to a method of forming wirings in the semiconductor integrated circuit device which is highly refined and integrated such as 4 megabit or 16 megabit type SRAM.

Figure 1A:
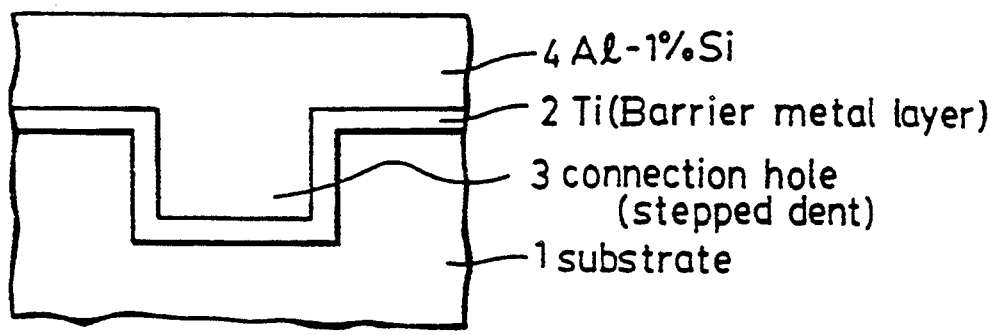
Figure 1B:
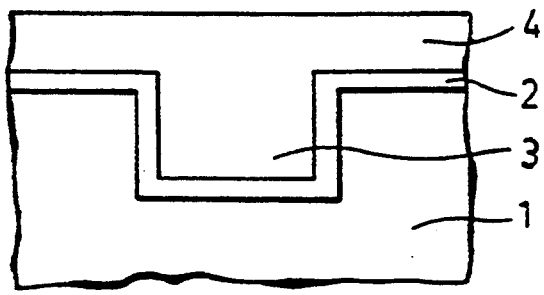
Figure 1C:
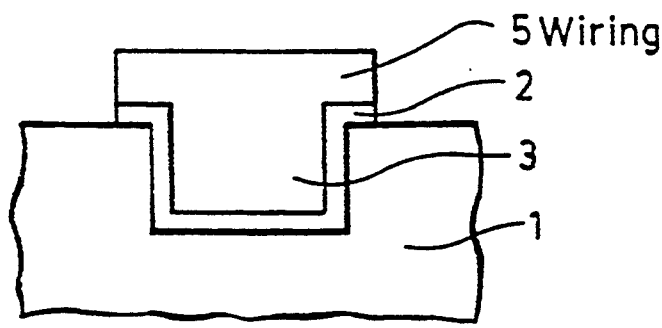

In this example, Al-1% Si wiring material 4 was deposited by a high temperature bias sputtering at 450° C. to the entire surface of a substrate 1 such as made of silicon having a Ti barrier metal layer 2 of 500 Å thickness in which a connection hole 3 of 0.8 um hole diameter and 0.5 um of depth is opened, thereby applying filling and surface flattening for the connection hole 3 (refer to FIG. 1(a)). Then, the Al film 4 was entirely etched back by means of RIE or the like using a $BCl_3$ gas and left to such a thickness, for example, of 4000 Å as causes no trouble in the subsequent flattening for the inter-layer film (refer to FIG. 1(b)). Subsequently, a wiring pattern is baked by a lithographic step and a wiring 5 was formed by means of RIE or the like again as shown in FIG. 1(c). In this way, it is possible to fill and flatten the connection hole by high temperature sputtering of thin Al layer causing no trouble in the subsequent flattening for the inter-layer film.

In a case where the quality of the Al bias sputtering film is poor, there may be a method of etching back to remove all the Al material while leaving only the portion filled in the connection hole and again forming a usual sputtering Al layer. However, since the quality of the Al film sputtered at a high temperature is not so poor, the method of redepositing Al after etching off the entire surface is rather troublesome requiring two procedures and, accordingly, a method of etching back to a predetermined film thickness from the first is excellent in view of the simplicity of the step and the improvement of the productivity, in order for filling and flattening a connection hole with a thin film thickness, which is the first object of the present invention.

Further, in a case of leaving Al only in the connection hole by the entire surface etching back, the etching speed is increased at an instance when the Al remains only in the connection hole due to the loading effect at that portion, making it extremely difficult to leave Al only in the connection hole with no scattering and under good controllability over the entire surface. On the contrary, since the foregoing problems are not caused in the etching back of merely reducing the Al layer thickness over the entire surface of the substrate, the object can be attained relative easily.

EXAMPLE 2

The second feature of the present invention is embodied in this example, in which the invention is applied to the method of forming wirings of a refined semiconductor as in Example 1 having the barrier metal layer.

Figure 2:
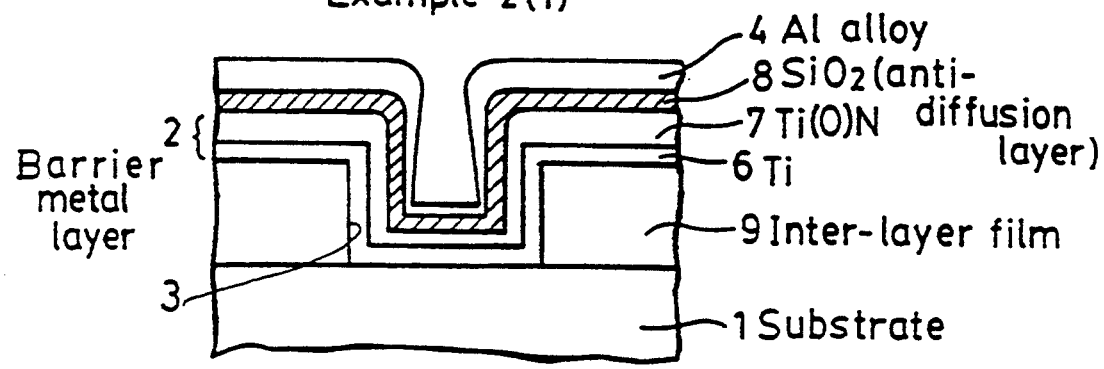
FIG. 2 is a cross sectional view illustrating the step coverage of the deposited materials to the connection holes in the second embodiment.
Figure 3:
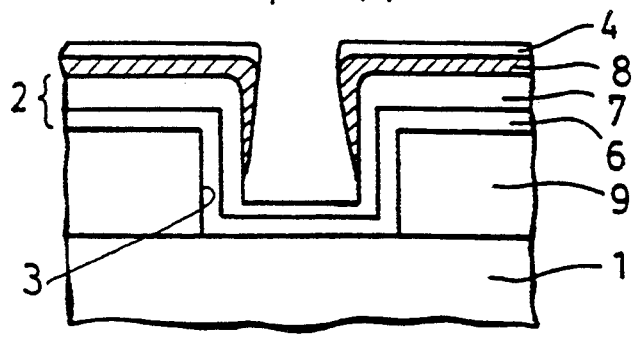
FIG. 3 is a cross sectional view of the deposited materials after reverse sputtering in the second embodiment.
Figure 4A:
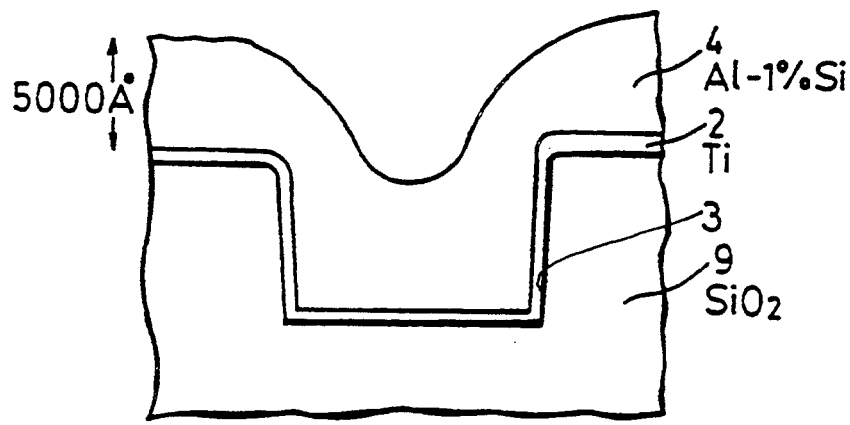
FIGS. 4a and 4b are each a cross sectional view illustrating the difference of the filling shape of connection hole depending on the thickness of the Al film.
Figure 4B:
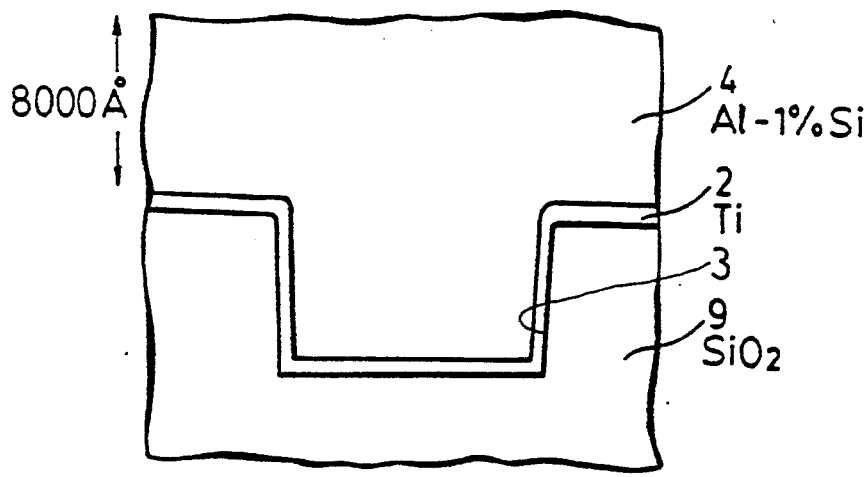

In this example, a Ti film 6 and a Ti(O)N film 7 (or a laminate layer of a Ti film, a Ti(O)N film and a Ti film) as a barrier metal layer 2 is conformally formed on the entire surface of a substrate such as made of silicon having a connection hole 3 opened therein with a diameter of 0.8 um and a depth of 0.5 um as shown in FIG. 2, a $SiO_2$ 8 was formed to a thickness of 200 Å in order to prevent diffusion of Ti into the Al layer 4, and then Al (Si-containing Al alloy) was sputtered at high temperature to a thickness 200 to 500 Å. Since coverage of the Al layer 4 in the contact hole is poor, Al is deposited only thinly at the bottom of the hole as compared with that in the upper portion as shown in FIG. 2. Accordingly, by subsequently applying reverse sputtering in an appropriate extent to remove materials, that is, about 300 Å of the materials including the Al 4 and $SiO_2$ 8 at the bottom of the hole 3 are removed while leaving $SiO_2$ 8 in the upper portion of the hole as shown in FIG. 3, to form a $SiO_2$ layer 8 as an anti-diffusion layer of the barrier metal layer 2 on the inter-layer film 9. Then, when Al is deposited continuously to a required layer thickness, a contact is formed by way of the Ti(O)N barrier metal layer at the bottom of the hole 3, while the Al film is formed on the anti-diffusion layer 8 on the inter-layer film 9 to prevent the diffusion of Ti. Accordingly, wirings with large grain size of the Al film 4 and excellent electro-migration resistance can be realized.

As has been described above specifically, according to the first feature of the present invention, filling and flattening of the connection hole by the Al series material such as Al alloy or Al can be attained by a high temperature or high temperature bias sputtering method with such a thickness of the Al film as not causing troubles in the flattening of the inter-layer film, as well as etching back can be applied at good controllability without causing micro-loading effect by the entire surface etching back. Further, according to the second feature of the present invention, it is possible to form wirings capable of effectively preventing the degradation of the electro-migration resistance of the Al film due to the diffusion of Ti into Al by the anti-diffusion layer $SiO_2$ or the like while preventing Al from passing through in the contact portion due to the TiN or TiON barrier metal. Then, practical problems in the technique for forming wirings in semiconductor device production steps can be overcome by each of the features of the present invention.

What is claimed is:

1. A method of forming a wiring, said method comprising the steps of:

forming a barrier layer conformably on the entire surface of a substrate having a contact hole with a bottom;

forming an anti-diffusion layer on the barrier layer;

forming a layer of an aluminum series wiring material over the entire surface of the substrate; and then removing the anti-diffusion layer and the layer of an aluminum series wiring material from around a portion of the bottom of the contact hole.

2. A method according to claim 1, which includes, after the step of removing, filling the contact hole with an aluminum series wiring material.

3. A method according to claim 2, wherein the aluminum series wiring material which is used for both the step of forming a layer and the step of filling the contact hole is a silicon containing aluminum alloy.

4. A method according to claim 1, wherein the barrier layer comprises a Ti film and a Ti(O)N film, said anti-diffusion layer is $SiO_2$ and the layer of an aluminum series wiring materials is an Al-1% Si alloy.

* * * * *